United States Patent [19]
Koizumi et al.

[11] Patent Number: 5,763,124
[45] Date of Patent: Jun. 9, 1998

[54] METHOD OF FORMING A RESIST PATTERN UTILIZING CORRELATION BETWEEN LATENT IMAGE HEIGHT, RESIST PATTERN LINEWIDTH AND THERMAL ANNEALING PARAMETER

[75] Inventors: Taichi Koizumi; Takahiro Matsuo, both of Osaka, Japan

[73] Assignee: Matsushita Electric Industrial Co., Ltd., Osaka, Japan

[21] Appl. No.: 890,680

[22] Filed: Jul. 9, 1997

Related U.S. Application Data

[62] Division of Ser. No. 557,701, Nov. 13, 1995.

[30] Foreign Application Priority Data

Nov. 14, 1994 [JP] Japan ................... 6-279132

[51] Int. Cl.$^6$ .................. G03C 5/00; G03F 7/26
[52] U.S. Cl. .................. 430/30; 430/311; 430/330
[58] Field of Search .................. 430/310, 311, 430/330

[56] References Cited

U.S. PATENT DOCUMENTS 4,670,650  6/1987  Matsuzawa et al. ................ 250/307

FOREIGN PATENT DOCUMENTS 3-248414  11/1991  Japan .
6-267824  9/1994  Japan .

OTHER PUBLICATIONS

J. Sturtevant et al., "Use of Scatterometric Latent Image Detector in Closed Loop Feedback Control of Linewidth", SPIE vol. 2196, pp. 352–359.

Shoaib Zaidi et al., "Metrology sensors for advanced resists," SPIE vol. 2196, pp. 341–351.

John L. Sturtevant et al., "Post–exposure bake as a process–control parameter for chemically–amplified photoresist," SPIE vol. 1926, pp. 106–114.

Michael T. Postek, "Integrated Circuit Metrology, Inspection, and Process Control VII," 1926, pp. 107–114.

*Primary Examiner*—Christopher G. Young
*Attorney, Agent, or Firm*—McDermott, Will & Emery

[57] ABSTRACT

A first correlation is obtained which is a correlation between latent image height produced after exposure on a resist layer, and resist pattern linewidth for a given length of develop time. Additionally, a second correlation is obtained which is a correlation between develop time for each exposure energy dose and resist pattern linewidth. The height of a latent image produced on an actually exposed resist layer is determined. From the first correlation, an estimated resist pattern linewidth, which is a resist pattern linewidth corresponding to a latent image height and to a given length of develop time, is found. From the second correlation, an estimated exposure energy dose, which is an exposure energy dose corresponding to a given length of develop time and to an estimated resist pattern linewidth, is found. Additionally, also from the second correlation, develop time corresponding to a target resist pattern linewidth and to an estimated exposure energy dose is found, and according to the develop time found, a resist pattern is formed.

3 Claims, 16 Drawing Sheets

F I G. 6
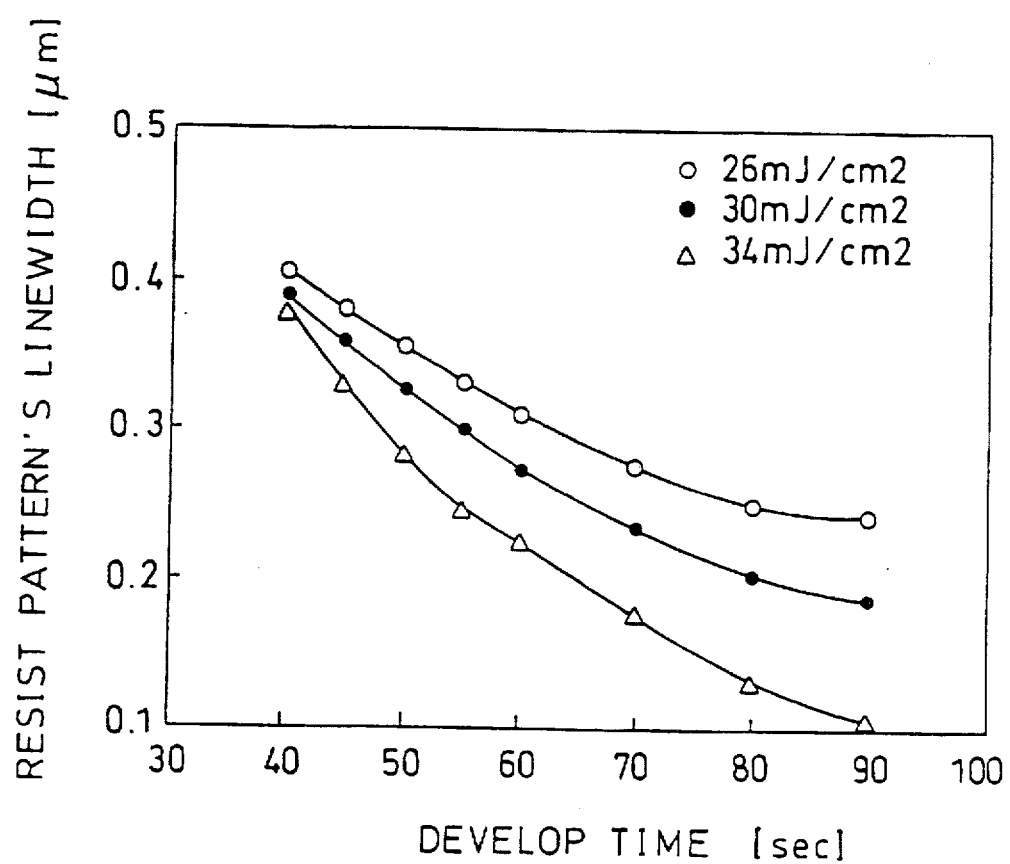

METHOD OF FORMING A RESIST PATTERN UTILIZING CORRELATION BETWEEN LATENT IMAGE HEIGHT, RESIST PATTERN LINEWIDTH AND THERMAL ANNEALING PARAMETER

This is a Divisional of U.S. patent application Ser. No. 08/557,701, filed Nov. 13, 1995, Now allowed.

BACKGROUND OF THE INVENTION

This invention generally relates to a method of forming a resist pattern during the fabrication of a semiconductor device or the like. It particularly pertains to a method of forming a resist pattern by means of a lithography technique using as an exposure energy source ultraviolet rays, X-rays, charge beams (below 450 nm), i-lines (365 nm), KrF excimer laser (248 nm), ArF excimer laser (193 nm), or the like.

Recently, semiconductor devices have been miniaturized remarkably. Present develop-level design rules are 0.25-μm. Therefore, stringent specifications of RPL (resist pattern's linewidth) are now required. A conventional way of positively reducing variations in size produced in a lithography process is to reduce in-chip size variations or to reduce in-wafer size variations. Size variations are produced mainly because of multiple interference effects in a resist layer and reflected light from a substrate. Therefore, a reflection prevention layer, formed on a surface of a substrate, may reduce size variations produced in a lithography process. Alternatively, a silylation process, i.e., a surface modification process, may be useful in reducing size variations due to a lithography process.

Although wafer-to-wafer or lot-to-lot RPL variations have not been given much attention conventionally, reductions in RPL variations are required because of recent severe RPL specifications. A few cases in relation to wafer-to-wafer RPL variations have been reported in recent years.

It is presumed that wafer-to-wafer RPL variations are caused by variations in the substrate structure (e.g., variations in the resist layer thickness) or are caused by an exposure tool used, resulting in producing not only the difference between an intended exposure energy dose and an exposure energy dose actually absorbed in a resist layer but also the difference between an intended exposure focus and an actual exposure focus. These differences are considered to produce RPL variations.

John Sturtevant et al show a technique in their report (1994 SPIE, vol. 2196, pp 352–359). In accordance with this technique, a latent image produced on a resist layer surface is illuminated with laser beams and the intensity of resulting diffracted light is detected. More specifically, a correlation between diffracted light's intensity and RPL is previously obtained. The length of develop time is calculated in order that a target RPL is obtained from the intensity of diffracted light detected during or after the post-exposure bake (PEB) process. The result of the calculation is fed forward to a develop process for RPL control. Shoaib Zaidi et al show a technique using a surface modification process in their report (1994 SPIE vol. 2196, pp 341–351). In accordance with this technique, a latent image produced on a resist layer surface is illuminated with laser beams. The intensity of resulting diffracted light is detected to estimate an RPL. Surface modification process parameters are corrected to compensate for RPLs.

Both the above techniques use diffracted light rays, which means that they need a repeat pattern. It becomes necessary either to provide a repeat pattern or to make utilization of a repeat pattern within a device structure. This produces the problem that latent image patterns are limited.

Additionally, laser beams, which penetrate a resist layer, are influenced by reflected light from its underlying layer, so that wrong detection of the intensity of diffracted light may occur.

Accordingly, a main object of this invention is to provide a technique capable of RPL estimation without depending upon light diffracted, in order to eliminate wafer-to-wafer RPL variations and to provide stability in RPL.

SUMMARY OF THE INVENTION

Accordingly, the present invention provides a first method of forming a resist pattern. The first resist pattern formation method is based on the knowledge that there is a correlation between RPL and exposure condition actually used for resist layer exposure and is further based on the knowledge that there is a correlation between latent image's height and exposure condition actually used for resist layer exposure. By using actual exposure conditions as parameters, an RPL is estimated from a latent image height.

The first resist pattern formation method comprises the following steps:

(a) forming a resist layer on a substrate;

(b) exposing the resist layer to light to a predetermined pattern;

(c) developing the pattern-exposed resist layer for resist pattern formation;

the method further comprising the following steps of:

(d) pre-finding a first correlation between the height of a latent image produced after an exposure process on a resist layer, and the linewidth of a resist pattern with respect to a given value of a develop process parameter which affect the way in which a resist-pattern linewidth is defined, and also pre-finding a second correlation between the given value of the process parameter with respect to an exposure energy condition or with respect to an exposure focus condition, and resist-pattern linewidth;

(e) determining a latent-image height produced on an actually exposed resist layer;

(f) finding, from the first correlation, an estimated linewidth which is a resist-pattern linewidth corresponding to the latent-image height determined and to the given value of the process parameter;

(g) finding, from the second correlation, an estimated exposure condition which is an exposure condition corresponding to the given value of the process parameter and to the estimated linewidth;

(h) finding, from the second correlation, a value of the process parameter corresponding to a target resist-pattern linewidth and to the estimated exposure condition, and forming, based on the process parameter value found, a resist pattern.

There is a latent image height versus resist pattern linewidth correlation (the first correlation). In accordance with the first resist layer formation method of this invention, an estimated linewidth, which corresponds to a latent image height and to a develop process parameter value, is found from the first correlation. As a result of such arrangement, resist pattern linewidth estimation is performed at high accuracy.

Further an estimated exposure condition, which corresponds to a predetermined parameter value and to an estimated linewidth, is found from the second correlation. As a result of such arrangement, since an estimated linewidth is almost correct, it is possible to estimate an exposure condition which was actually used to expose a resist layer.

A parameter value, which corresponds to a target resist pattern linewidth and to an estimated exposure condition, is found from the second correlation. This makes it possible to find a parameter value which corresponds to an exposure condition which was actually used for exposure of a resist layer. When a develop process is performed according to that parameter value, it is possible to achieve a target resist pattern linewidth. Since a resist pattern linewidth can be estimated correctly without using diffracted light, this eliminates wafer-to-wafer linewidth variations and provides stability in resist pattern linewidth even when pattern exposure conditions vary.

The develop process parameter of the first method may be a develop time parameter. This further reduces wafer-to-wafer linewidth variations because of control of the length of develop time which greatly affects a resist pattern linewidth.

The present invention provides a second method of forming a resist pattern. The second resist pattern formation method comprises the following steps:

(a) forming a resist layer on a substrate;
(b) exposing the resist layer to light to a predetermined pattern;
(c) subjecting the pattern-exposed resist layer to a thermal annealing process;
(d) developing the resist layer for resist pattern formation; the method further comprising the steps of:
(e) pre-finding a first correlation between the height of a latent image produced after an exposure process on a resist layer and the linewidth of a resist pattern with respect to a given value of a thermal annealing process parameter which affects the way in which a resist-pattern linewidth is defined, and also pre-finding a second correlation between the given value of the process parameter with respect to an exposure energy condition or with respect to an exposure focus condition, and resist-pattern linewidth;
(f) determining a latent-image height produced on an actually exposed resist layer;
(g) finding, from the first correlation, an estimated linewidth which is a resist-pattern linewidth corresponding to the latent-image height determined and to the given value of the process parameter;
(h) finding, from the second correlation, an estimated exposure condition which is an exposure condition corresponding to the given value of the process parameter and to the estimated linewidth;
(i) finding, from the second correlation, a value of the process parameter corresponding to a target resist-pattern linewidth and to the estimated exposure condition, and performing, based on the process parameter value found, a thermal annealing process on a resist layer.

In the second resist pattern formation method, a thermal annealing process is carried out according to a thermal annealing process parameter value. This achieves a target resist pattern linewidth. Since a resist pattern linewidth can be estimated correctly without using diffracted light, this eliminates wafer-to-wafer linewidth variations and provides stability in resist pattern linewidth even when pattern exposure conditions vary.

The thermal annealing process parameter of the second method may be a thermal annealing process time parameter or a thermal annealing process temperature parameter. This further reduces wafer-to-wafer linewidth variations because of control of the length of thermal annealing process time or the thermal annealing process temperature which greatly affects a resist pattern linewidth.

The present invention provides a third method of forming a resist pattern. The third resist pattern formation method comprises the following steps:

(a) forming a resist layer on a substrate;
(b) exposing the resist layer to light to a predetermined pattern;
(c) performing a modification layer formation process to form a surface modification layer locally on the resist layer;
(d) developing the resist layer for resist pattern formation; the method further comprising the steps of:
(e) pre-finding a first correlation between the height of a latent image produced after an exposure process on a resist layer, and the width of a surface modification layer with respect to a given value of a modification layer formation process parameter which affects the way in which a surface modification layer-width is defined, and also pre-finding a second correlation between the given value of the process parameter with respect to an exposure energy condition or with respect to an exposure focus condition, and surface modification layer-width;
(f) determining a latent-image height produced on an actually exposed resist layer;
(g) finding, from the first correlation, an estimated modification layer-width which is a surface modification layer-width corresponding to the latent-image height determined and to the given value of the process parameter;
(h) finding, from the second correlation, an estimated exposure condition which is an exposure condition corresponding to the given value of the process parameter and to the estimated modification layer-width;
(i) finding, from the second correlation, a value of the process parameter corresponding to a target surface modification layer-width and to the estimated exposure condition, and forming, based on the process parameter value found, a surface modification layer.

There is a latent image height versus resist pattern linewidth correlation (the first correlation). In accordance with the third resist layer formation method of this invention, an estimated modification layer linewidth, which corresponds to a latent image height and to a modification layer formation process parameter value, is found from the first correlation. As a result of such arrangement, modification layer linewidth estimation is performed at high accuracy.

Further, an estimated exposure condition, which corresponds to a predetermined parameter value and to an estimated surface modification layer linewidth, is found from the second correlation. As a result of such arrangement, since an estimated modification layer linewidth is almost correct, it is possible to estimate an exposure condition which was actually used to expose a resist layer.

A parameter value, which corresponds to a target resist pattern linewidth and to an estimated exposure condition, is found from the second correlation. This makes it possible to find a parameter value which corresponds to an exposure condition which was actually used to expose a resist layer. The resist pattern linewidth depends much upon the surface modification layer width, so that, when a surface modification layer is formed according to a parameter value corresponding to an exposure condition that was actually used for exposure of a resist layer, it is possible to achieve a target resist pattern linewidth. Since a resist pattern linewidth can be estimated correctly without using diffracted light, this eliminates wafer-to-wafer linewidth variations and provides stability in resist pattern linewidth even when pattern exposure conditions vary.

The modification layer formation process parameter of the third method may be a modification layer formation process time parameter or a modification layer formation process temperature parameter. This further reduces wafer-to-wafer linewidth variations because of control of the modification layer formation process time or the modification layer formation process temperature which greatly affects a resist pattern linewidth.

In each of the first to third resist pattern formation method, it is preferable to determine a latent image height with an atomic force microscope. Since the atomic force microscope is capable of determining irregular topographies in the order of nm precision, it can determine a latent image's height in the order of nm precision. Therefore, it is possible to find exact process parameter values in a develop process, a thermal annealing process, or a surface modification layer formation process, whereupon a resist pattern linewidth can be obtained correctly.

The present invention provides a fourth method of forming a resist layer. The fourth resist layer formation method comprises the following steps:

(a) pre-obtaining a correlation between the width of surface modification layer formed on a resist layer and the linewidth of resist pattern resulting from developing the resist layer having thereon the surface modification layer;

(b) forming an actual resist layer on a substrate;

(c) exposing the actual resist layer to light to a predetermined pattern;

(d) forming an actual surface modification on the actual resist layer having the predetermined pattern;

(e) determining the width of the actual surface modification layer, and obtaining from the pre-found correlation an estimated linewidth which is a resist patternlinewidth corresponding to the actual surface modification layer width determined;

(f) determining whether the estimated linewidth falls in a range of tolerance limits of a target linewidth, wherein if the estimated linewidth is found to fall in the range a develop process is performed on the actual resist layer to form a resist pattern, while on the other hand if the estimated linewidth is found not to fall in the range the actual resist layer is removed away from the substrate.

There is a surface modification layer width versus resist pattern linewidth relationship. Therefore, it is possible to obtain from such a relationship an almost correct estimate of the linewidth by finding a resist pattern linewidth corresponding to an actual surface modification layer's width.

In accordance with the fourth resist pattern formation method, it is possible to remove a poor resist layer without exposing a substrate. This reduces substrate damage. Therefore, not only wafer-to-wafer linewidth variations but also semiconductor device characteristic variations can be reduced.

In each of the third and fourth resist pattern formation methods, it is preferable that the resist layer is composed of a resist which generates an acid when pattern-exposed to light, and that the surface modification layer is a metallic oxide layer which is formed such that an exposed portion of the resist layer is made to absorb moisture and then moisture and metallic alkoxide are applied onto a surface of the moisture containing exposed portion for forming the metallic oxide layer on the exposed portion surface. As a result of such arrangement, when forming a metallic oxide layer acting as a surface modification layer, it is possible to obtain an almost correct estimation of the resist pattern linewidth by determining the width of that metallic oxide layer.

In each of the third and fourth resist pattern formation methods, it is preferable that the surface modification layer is a silylated layer which is formed on a surface of an unexposed portion of the resist pattern. As a result of such arrangement, when forming a silylated layer acting as a surface modification layer, it is possible to obtain an almost correct estimation of the resist pattern linewidth by determining the width of that silylated layer.

In the fourth resist pattern formation method, it is preferable to determine the width of a surface modification layer with an atomic force microscope. Since the atomic force microscope is capable of determining irregular topographies in the order of nm precision, it can determine the width of a surface modification layer in the order of nm precision.

BRIEF DESCRIPTION OF THE DRAWINGS

FIG. 6 is a graph showing a second correlation between develop time and RPL in the first preferred embodiment method.

DETAILED DESCRIPTION OF THE INVENTION

Preferred embodiments of this invention are described with reference to the accompanying drawing figures. In each of the preferred embodiments of this invention, exposure conditions are exposure energy doses; however, exposure focus may be used instead of using exposure energy doses.

EMBODIMENT 1

Figure 1:
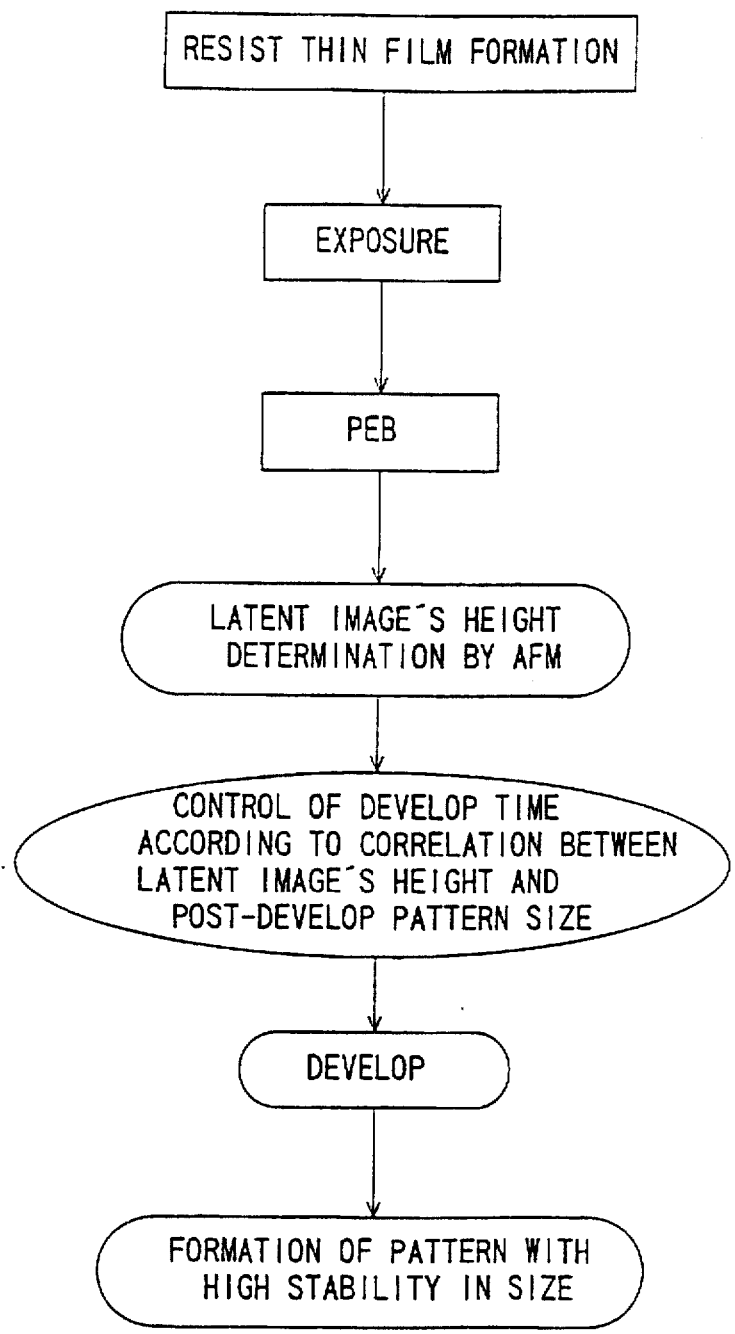
FIG. 1 is a diagram outlining a sequence of process steps for forming a resist pattern according to a first preferred embodiment of the present invention.

Referring first to FIG. 1, there is shown a sequence of steps of forming a resist pattern according to a first preferred embodiment of this invention. A resist layer is formed on a substrate. The resist layer is exposed to light to a predetermined pattern. Thereafter, the resist layer is subjected to a PEB process. A calculation is made to determine a latent image's height using an AFM. The length of develop time is derived from a pre-found relationship between latent image's form and post-develop pattern size. According to the develop time thus derived, a develop process is performed on the resist layer to form a resist pattern with high stability in size.

Referring now to FIGS. 2–7, a method of forming a resist pattern according to the present embodiment is detailed. In the present embodiment, develop process parameters, which affect the way in which RPL is defined, are the length of develop time. Developer temperature or concentration may be used instead.

In a first step of the resist pattern formation of the present embodiment, a first correlation is obtained. This first correlation is a correlation between latent image's height (the height of a latent image produced after exposure on a resist layer) and RPL (the linewidth of a resist pattern for a given length of develop time), which is derived as follows.

An exposure energy dose (the intensity of exposure x time) versus latent image's height relationship is first found. ASKA, which is a KrF excimer laser resist, is deposited on a silicon substrate, having a film thickness of 0.98 gm. With a KrF excimer laser stepper, an exposure process is performed on the resist layer for an exposure energy dose range between 22 and 38 mJ/cm². Thereafter, a thermal annealing process is performed on the resist layer at a temperature of 95° C. for 90 seconds. An AFM is used to determine the height of a latent image produced on a 0.25-gm L/S (line/space) pattern.

Figure 2:
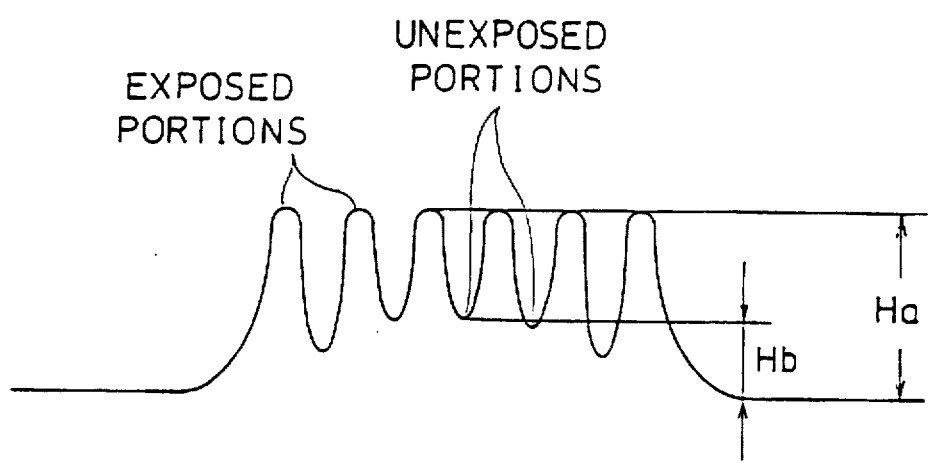
FIG. 2 is an AFM cross section of a surface of a resist layer in accordance with the first preferred embodiment method.

FIG. 2 shows the observation of an AFM cross section of a resist layer surface. Ha is the height of a latent image at an exposed portion of the resist layer and Hb is the height of a latent image at an unexposed portion of the resist layer. Ha and Hb are somewhat exaggeratedly shown for easy understanding.

Figure 3:
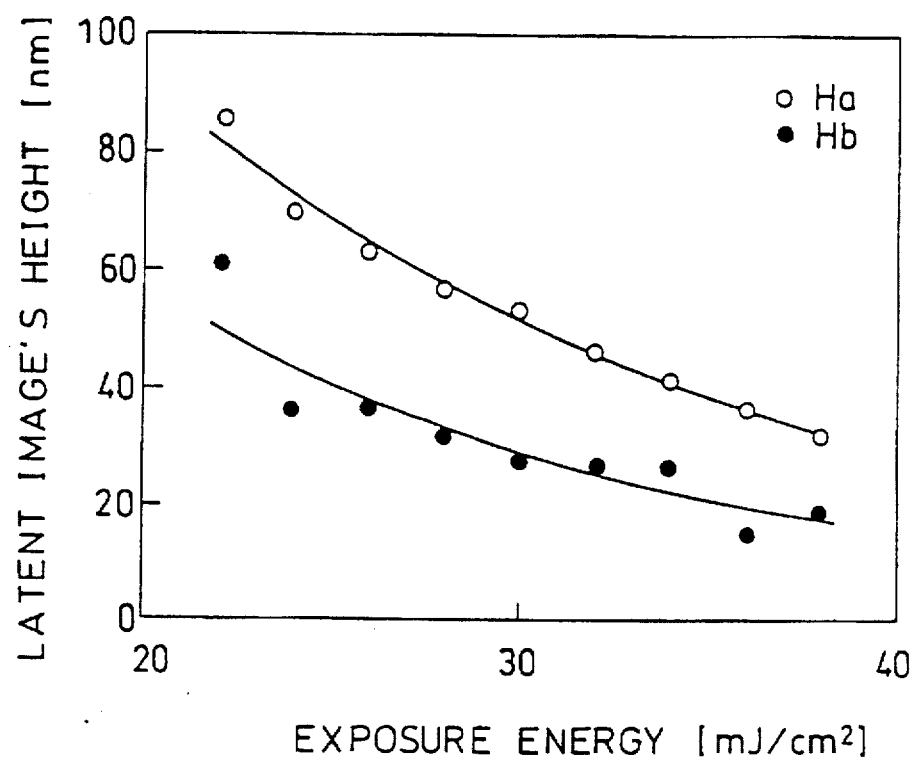
FIG. 3 is a graph showing a relationship between exposure energy dose and latent image's height in the first preferred embodiment method.

FIG. 3 is a graph showing an exposure energy dose versus latent image's height relationship for a central line pattern as a sample pattern. As can be seen from the graph, there is a specific connection between exposure energy dose and latent image's height. The same relationship may be obtained for any other line pattern other than a central line pattern.

Next, a relationship between exposure energy dose and RPL for a given length of develop time is found.

Likewise, a resist layer is exposed and then is developed using NMD-3 (tradename: TMAH=2.38%) for, for example, 60 seconds, to form a 0.25-µresist pattern the RPL of which is then determined.

Figure 4:
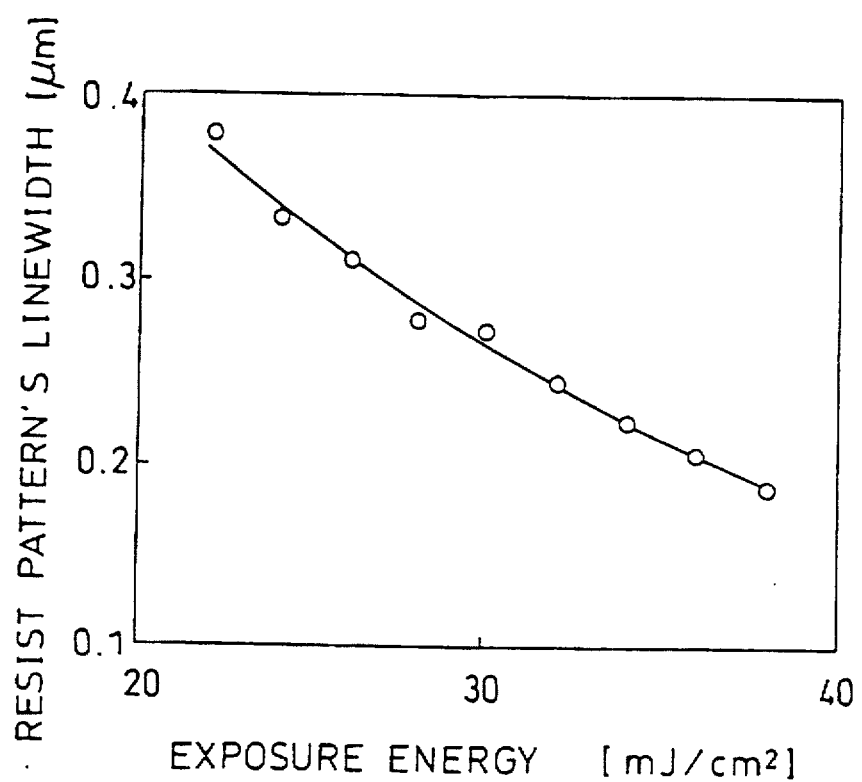
FIG. 4 is a graph showing a relationship between exposure energy dose and RPL in the first preferred embodiment method.

FIG. 4 shows a relationship between exposure energy dose and RPL (the develop time: 60 seconds). As can be seen from FIG. 4, there is specific connection between exposure energy dose and RPL.

Figure 5:
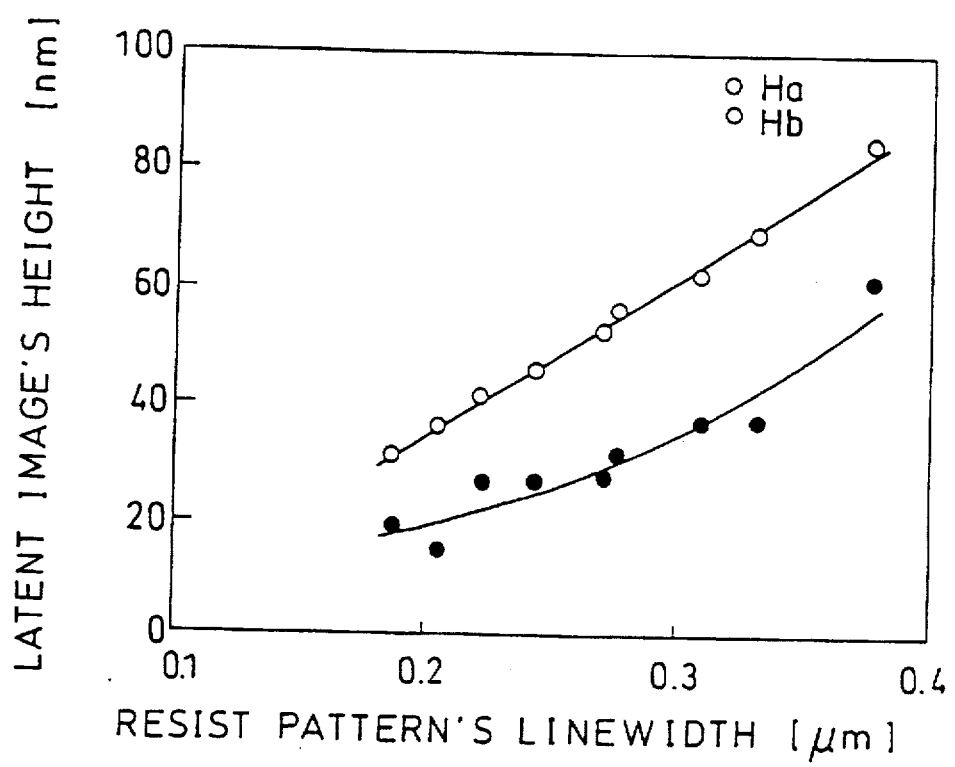
FIG. 5 is a graph showing a first correlation between latent image's height and RPL in the first preferred embodiment method.

Next, a first correlation, shown in FIG. 5, is derived from the above relations, i.e., the exposure energy dose versus latent image's height relationship, and the exposure energy dose versus RPL relationship. This first correlation is a correlation between the height of a latent image produced after exposure on a resist pattern and 60-second develop RPL.

In a second step of the present resist pattern formation, a second correlation is found. This second correlation is a correlation between develop time and RPL for each exposure energy dose. When an estimate of the RPL derived from an AFM latent image height is found not to fall in a range of RPL specifications, the second correlation is used to control an RPL to a predetermined value by changing develop time.

FIG. 6 shows second correlations for the following exposure energy doses: (i) 26 mJ/cm²; (ii) 30 mJ/cm²; and (iii) 34 mJ/cm².

In a third step of the present resist pattern formation, the height of a latent image produced by an actual pattern exposure process on a resist layer is determined or measured in the same way as the above.

In a fourth step of the present resist pattern formation, an estimated RPL, which is an RPL corresponding to a latent image's height determined and to a give length of develop time (e.g., 60 seconds), is found from the first correlation. A way of deriving an estimated RPL from the first correlation is described below in which a develop process is performed for 60 seconds. Suppose that a latent image is measured in height after the PEB process, and is found to have a height of 63 nm (Ha=63 nm). FIG. 5 shows that an estimate of the RPL is 0.31 µ, when a develop process is performed for 60 seconds.

In a fifth step of the present resist pattern formation, an estimated exposure energy dose, which is an exposure energy dose corresponding to a given length of develop time and to an estimated RPL, is derived from the second correlation. This estimated exposure energy dose is an energy dose that is actually absorbed in a resist layer. That is, FIG. 6 shows that, when a develop process is performed for 60 seconds, an estimated RPL of 0.31 µm is obtained at 26 mJ/cm². Therefore, an exposure energy does of 26-mJ/cm² is set as an estimated exposure energy dose.

In a sixth step of the present resist pattern formation, develop time, which corresponds to a target RPL and to an estimated exposure energy dose, is derived from the second correlation. That is, FIG. 6 shows that develop time, which corresponds to a 26-mJ/cm₂ exposure energy dose curve and to a target RPL (e.g., 0.25 m), is 80 seconds. Therefore, an actual develop process is performed for a period of 80 seconds. In the present embodiment, the height of latent images is determined by a high-accuracy AFM, the result of which is used to determine a length of develop time. The develop time determined is fed forward to a develop process. Such arrangement makes it possible to obtain an RPL without using diffracted light, thereby reducing wafer-to-wafer RPL variations.

A first evaluation test of the present embodiment is explained.

Figure 7:
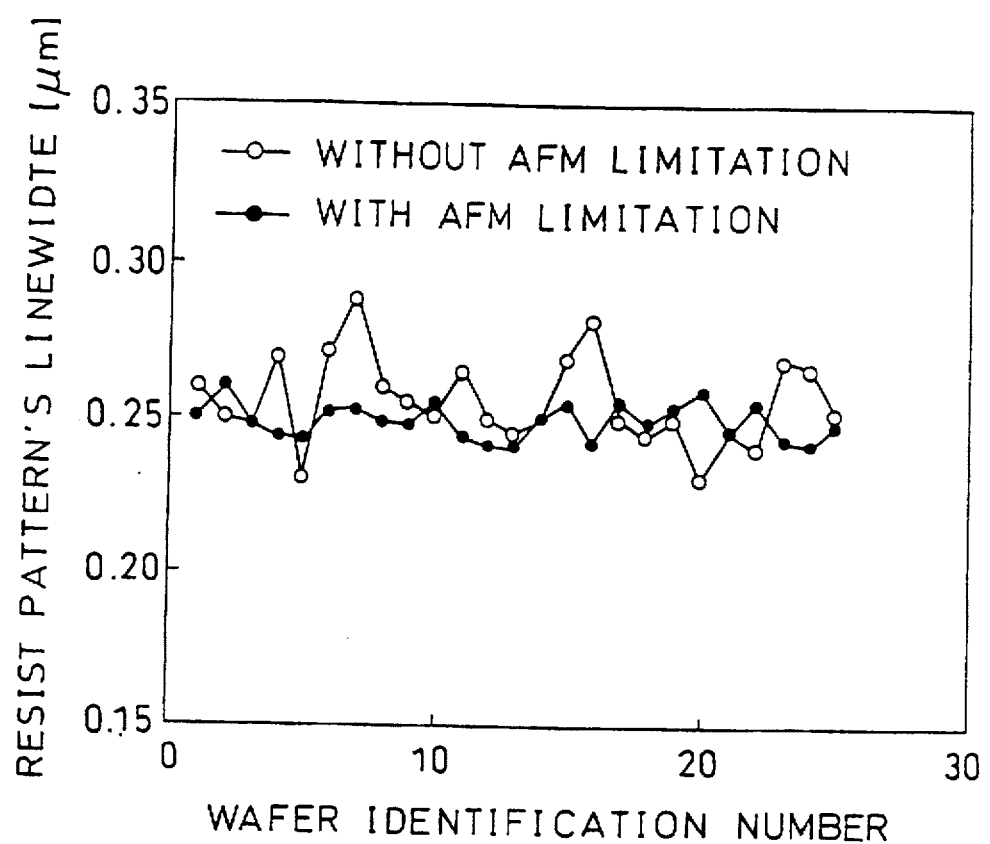
FIG. 7 is a graph for comparison in the degree of RPL variations between a case where the length of develop time is controlled and a case where the length of develop time is not controlled.

The first evaluation test was made as follows. With respect to a first group of 25 wafers to be processed consecutively, respective resist patterns were formed in accordance with the present embodiment, in other words the length of develop time was controlled on the basis of the AFM latent image's height measurement. Likewise, with respect to another group of 25 wafers to be processed consecutively, respective resist patterns were formed without develop time control, in other words without changing the original length of develop time. FIG. 7 shows that the former 25 wafers less varied in RPL than the latter 25 wafers.

Figure 8:
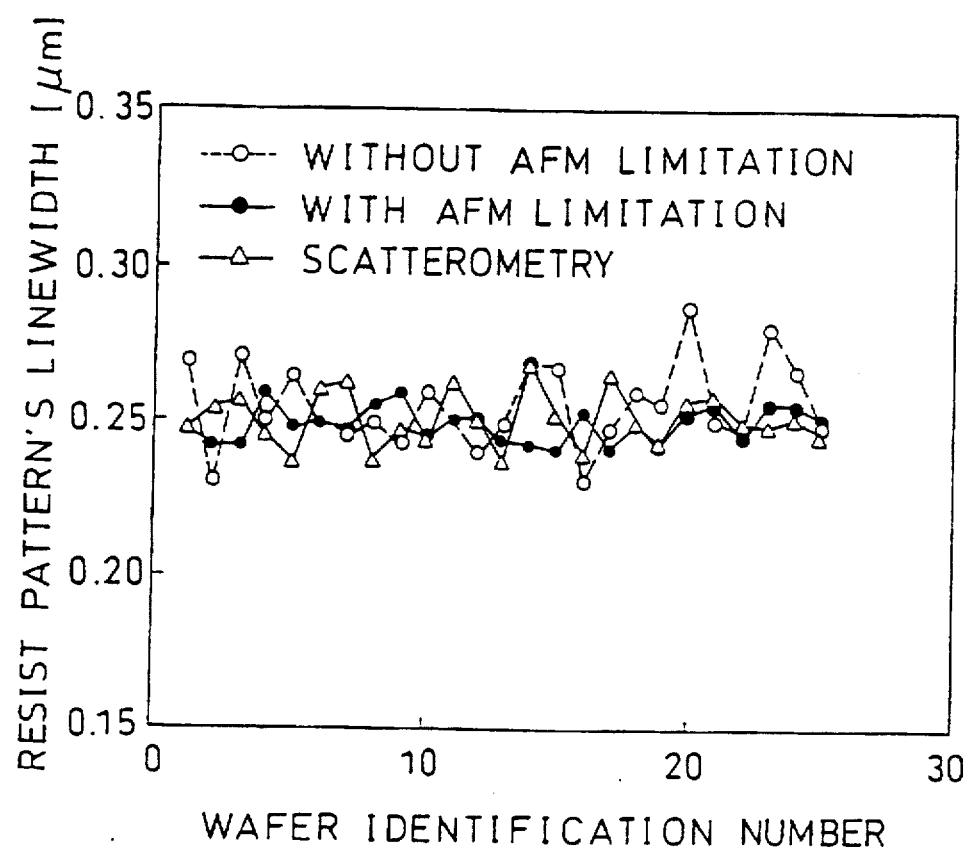
FIG. 8 is a graph for comparison in the degree of RPL variations between a case where the length of develop time is controlled, a case where the length of develop time is not controlled, and a case where the length of develop time is controlled using a scatterometry technique.
Figure 9:
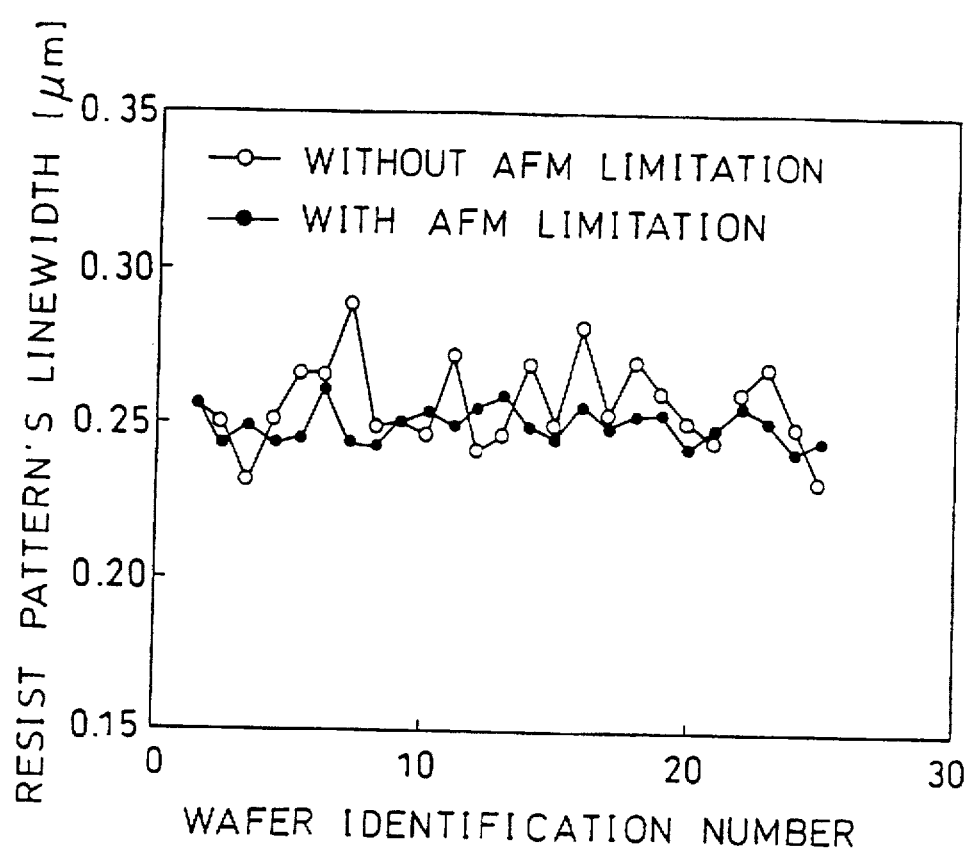
FIG. 9 is a graph for comparison in the degree of RPL variation between a case where the length of develop time is controlled and a case where the length of develop time is not controlled.

A second evaluation test of the present embodiment is explained. Like the first evaluation test, with respect to a first group of 25 wafers, respective resist patterns were formed in accordance with the present embodiment, in other words the length of develop time was controlled on the basis of the AFM latent image height measurement (i.e. the height of a latent image produced on a resist layer overlying an aluminum substrate). With respect to another 25 wafers, respective resist patterns were formed without develop time control. Further, with respect to still another 25 wafers, respective resist patterns were formed in accordance with a conventional technique, in other words the length of develop time was controlled on the basis of the intensity of light obtained by a scatterometry technique. As can be seen from FIG. 8. the 25 wafers of the first embodiment suffered from the least RPL variations. The AFM method is found to be better than the scatterometry technique in reducing the RPL variations, which may be explained as follows. In the scatterometry technique, detection laser beams pass through a resist layer down to an aluminum substrate from which they makes irregular reflection because of grains of the aluminum substrate and such reflection light is combined with the original detection light to produce poor detection accuracy. Conversely, in the AFM method, the height of a latent image produced on a resist layer surface is measured without using diffracted light, thereby avoiding the influence from substrate reflection, which seems to enable high-accuracy control to be achieved. A third evaluation test of the present embodiment is explained below. 25 wafers to be processed consecutively were prepared. With respect to these 25 wafers, an isolated resist pattern was formed in accordance with the present embodiment, in other words the length of develop time was controlled on the basis of the AFM latent image height measurement (i.e., the height of a latent image produced after exposure on a 0.25-µm resist pattern overlying a silicon substrate). Likewise, with respect to another 25 wafers, an isolated resist pattern was formed without develop time control, in other words without changing the original length of develop time. FIG. 9 shows that the former 25 wafers suffered from less RPL variations than the latter 25 wafers.

In the present embodiment, the first correlation is a correlation between the height of latent image produced after exposure on a resist pattern and RPL for a given value of a develop process parameter which affects the way in which a latent image's height is defined. Instead, the first correlation may be a correlation between the height of latent image produced after exposure on a resist pattern and RPL for a given value of a thermal annealing process parameter which affects the way in which a latent image's height is defined. whereupon an expected RPL, which is an RPL corresponding to a latent image's height and to a thermal annealing process parameter value, is derived from the first correlation. In such a case, thermal annealing parameters are thermal annealing time parameters or thermal annealing temperature parameters.

EMBODIMENT 2

Figure 10:
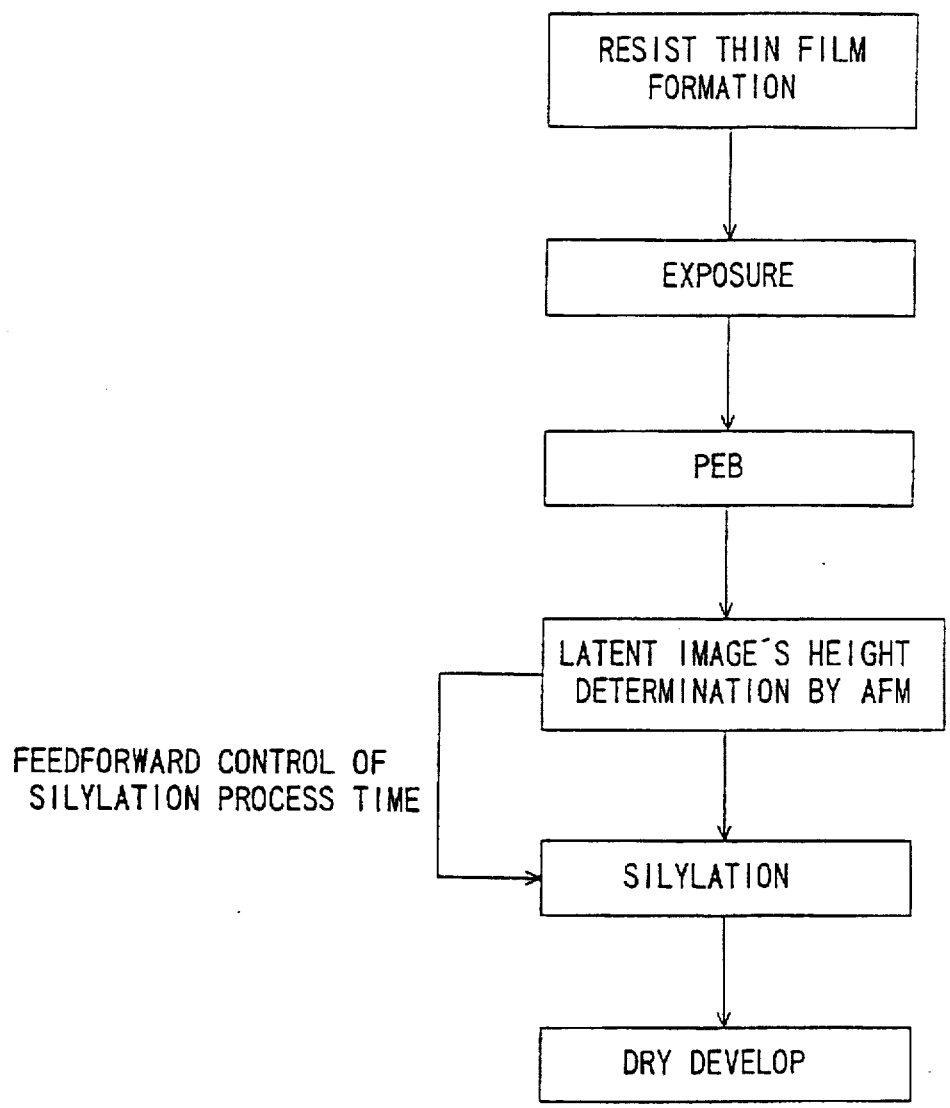
FIG. 10 is a diagram outlining a sequence of process steps for forming a resist pattern according to a second preferred embodiment of the present invention.

FIG. 10 outlines a sequence of process steps for forming a resist pattern according to a second preferred embodiment of the present invention. As shown in FIG. 10, a resist layer is formed on a substrate. The resist layer is exposed to light to a predetermined pattern. Thereafter, a PEB step is performed on the resist layer. An AFM is used to determine a latent image's height. Here, a pre-found relationship between latent image's height and post-develop pattern size is used to determine a length of silylation process time. A silylation processing is performed according to the silylation process time determined. Thereafter, a dry develop process is carried out to form a resist pattern.

Figure 11:
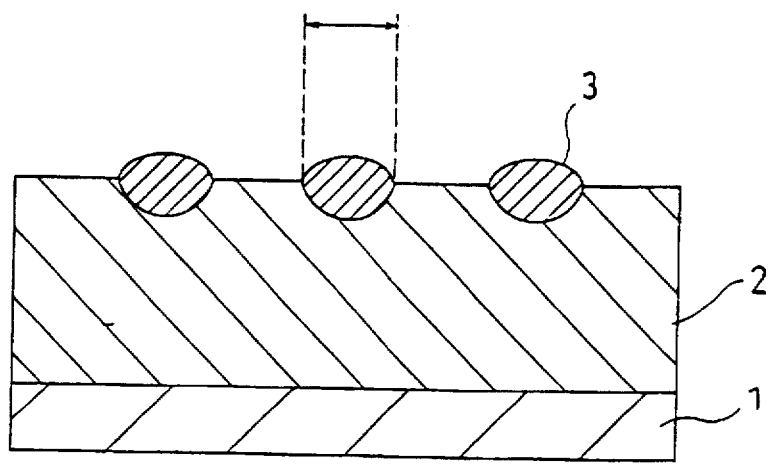
FIG. 11 is a cross section of a silylated layer formed by a silylation process in the second preferred embodiment method.

A method of forming a resist pattern in accordance with the present embodiment is detailed with reference to FIGS. 11–13. In the present embodiment, silylation process parameters, which affect the way in which a surface modification layer's width is defined, are silylation process time parameters. Instead, process time needed for forming a surface modification layer of any other kind or process temperature may be used.

In a first step of the resist pattern formation of the present embodiment, a first correlation is obtained. This first correlation is a correlation between latent image's height (the height of a latent image produced after exposure on a resist layer) and silylated layer's width (the width of a silylated layer for a given length of silylation process time), and is derived as follows.

An exposure energy dose versus latent image's height relationship is first found.

A resist (SAL 601 manufactured by Shipley) is deposited on a silicon substrate to form a resist layer having a film thickness of 1 µm. A KrF excimer laser stepper is used for exposure of the resist layer to light at various exposure energy doses. Unlike the first embodiment, the dose of exposure energy is chosen to suit a silylation process. Next, a thermal annealing process is performed on the resist pattern at110° C. for 60 seconds. Like the first embodiment, an AFM is used for determining a latent image's height, to find a relationship between exposure energy dose and latent image's height.

Next, a relationship between exposure energy dose and silylated layer's width for a given length of silylation process time is found. In other words, a silylated layer is formed by performing a silylation process on a resist pattern at various exposure energy doses, with a solution of hexamethylcyclotrisilazane (HMCTS) at 25 C at liquid phase for a given length of time. FIG. 11 shows a cross section of a 0.5-µm L/S silylated layer. Silylated layers are selectively formed on unexposed portions of the resist layer. Since the width of silylated layers depends on the exposure energy dose, there is specific connection between exposure energy dose and silylated layer's width. 1 is a silicon substrate. 2 is a resist layer formed on the silicon substrate 1. 3 is a silylated layer formed on a surface of the resist layer 2.

Next, a first correlation between latent image's height and silylated layer's width for a given length of silylation process time is derived from the above relationships, i.e., the exposure energy dose versus latent image height relationship and the exposure energy doses versus silylated layer width relationship.

In a second step of the present resist pattern formation, a second correlation between silylation process time for each exposure energy dose and silylated layer's width is found. When an estimate of the silylated layer's width derived from an AFM latent image height is found not to fall in a range of silylated layer's width specifications, the second correlation is used to control a silylated layer's width to a time.

Figure 12:
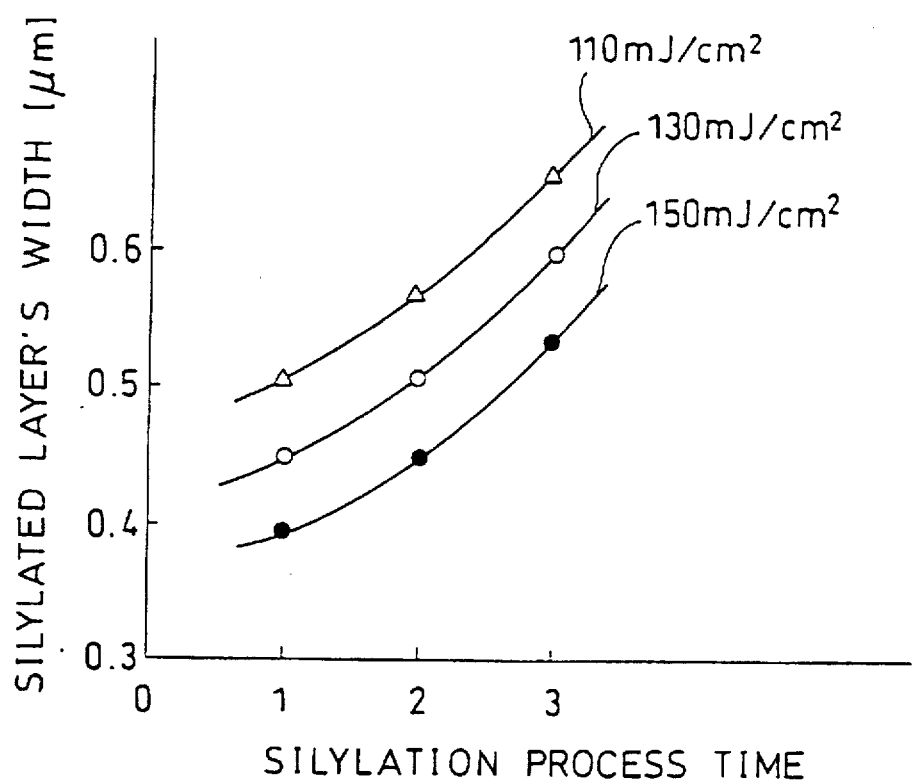
FIG. 12 is a graph showing a relationship between silylation process time and silylated layer's width in the second preferred embodiment method.
Figure 13:
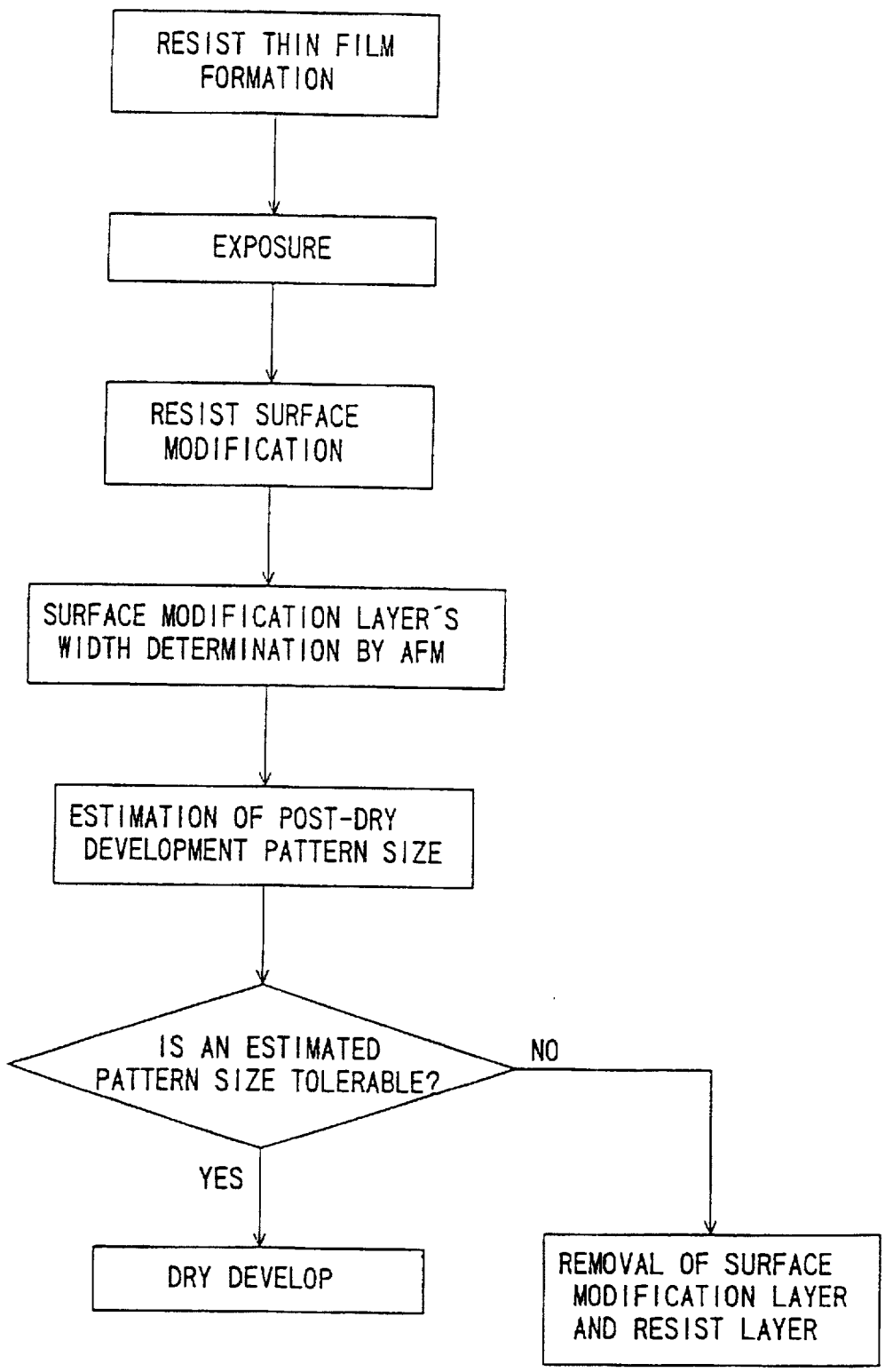
FIG. 13 is a diagram outlining a sequence of process steps for forming a resist pattern according to a third preferred embodiment of the present invention.

FIG. 12 shows second correlations for the following exposure energy doses: (i) 110 mJ/cm$^2$; (ii) 130 mJ/cm$^2$; and (iii) 150 mJ/cm$^2$. FIG. 12 shows that there is a correlation between silylation process time and silylated layer's width. In a third step of the present resist pattern formation, the height of a latent image produced by an actual pattern exposure process on a resist layer is determined.

In a fourth step of the present resist pattern formation, an estimated width, which is a silylated layer's width corresponding to a latent image's height determined and to a given length of silylation process time, is found from the first correlation.

In a fifth step of the present resist pattern formation, an estimated exposure energy dose, which is an exposure energy dose corresponding to a given length of silylation process time and to an estimated silylated layer's width, is found from the second correlation. This estimated exposure energy dose is an exposure energy dose that is actually absorbed in a resist layer.

In a sixth step of the present resist pattern formation, a length of silylation process time, which corresponds to a target silylated layer's width and to an estimated exposure energy dose, is derived from the second correlation. After an actual silylation process is performed for the silylation process time obtained, a resist layer having a silylated layer thereon is RIE-etched with O$_2$ plasma. Thereafter, a develop process is carried out to form a resist pattern.

Since the etch selectivity (i.e., the difference in etch rate between materials) for silylated layer and resist layer is about 16:1, a final resist pattern after dry develop has a linewidth that depends much upon a silylated layer's width. Therefore, it is possible to reduce wafer-to-wafer linewidth variations by means of feedforward control of the length of silylation process time. This was proved as follows. 25 wafers of 0.5-μm L/S were processed successively in which the length of silylation process time was feedforward-controlled. The result was that an wafer-to-wafer RPL variation of ±0.03 μm was reduced down to ±0.015 μm.

In the present embodiment, the height of a latent image is precisely determined using an AFM. Based on the result, the length of silylation process time is obtained, and is fed forward to a develop process. As a result of such arrangement, wafer-to-wafer linewidth variations can be reduced greatly. The height of a latent image may be determined by an AFM before a thermal annealing process prior to a silylation process for feedforward of the thermal annealing process time. Also in this case, the same effect as the above can be obtained.

In the first embodiment, ASKA, which is a KrF excimer laser resist, is used to form a resist layer. In the second embodiment, SAL601 is used to form a resist layer. Any other KrF excimer laser resist may be used. Other resists (e.g., g-line resist, i-line resist, ArF excimer laser resist, X-ray resist, and charge beam resist) may also be used. In using such resists, an exposure light source corresponding to a respective resist is used. NMD-3 is used as a developer.

Any other developer may be used instead. Dry develop may be carried out instead of wet develop.

An AFM, is used to determine a latent image's height. However, any other equipment capable of determining a latent image's height in the order of nm precision may be available. In the embodiments of this invention, the height of latent images is determined in an off-line manner but it may be performed in an in-line manner. The length of develop time or the length of surface modification process time may be controlled automatically.

EMBODIMENT 3

A third preferred embodiment of this invention is explained by reference to FIG. 13. FIG. 13 shows a sequence of steps of the formation of a resist pattern in accordance with the third embodiment. As shown in FIG. 13, a resist layer is formed on the substrate. The resist layer is exposed to light to a predetermined pattern. A surface modification layer is selectively formed at an exposed portion or unexposed portion of the pattern-exposed resist layer. Thereafter, a surface modification layer is determined in width using an AFM. A pre-found correlation between surface modification layer's width and post-develop pattern size is used to estimate a pattern size. If a pattern size estimated can be tolerated, then a develop process is performed on the resist layer. If a pattern size estimated cannot be tolerated, this results in removal of the resist layer together with the surface modification layers away from the substrate.

A way of forming a resist pattern in accordance with the present embodiment is described in detail with reference to FIGS. 14-17.

Figure 14:
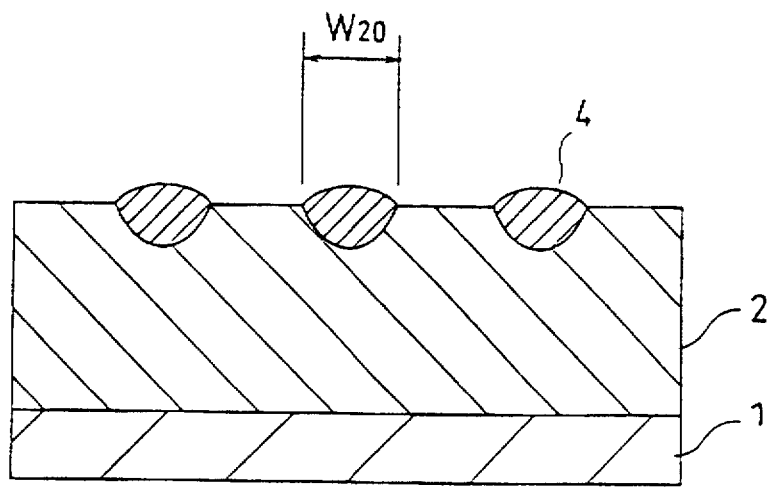
FIG. 14 is a process step in the third preferred embodiment method.
Figure 15:
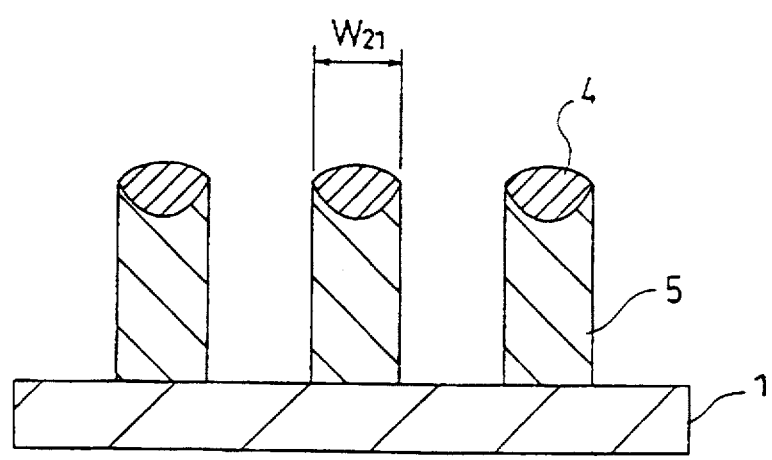
FIG. 15 is another process step in the third preferred embodiment method.

Referring now to FIG. 14, formed on a silicon substrate 1 is a 1-μm thick resist layer 2 composed of a copolymer of 1,2,3,4-tetrahydronaphthyldenimino-p-styrenesulfonate and methyl methacrylate. Thereafter, a KrF excimer laser stepper is used to expose the resist pattern 2 to a predetermined pattern, whereupon acid is generated at the surface of an exposed portion of the resist pattern 2. The resist layer 2 is then held in a humid atmosphere (the humidity: 95 %) at a temperature of 30° C. Methylethoxysilane (MTEOS) as alkoxyl silane gas and vapors are supplied onto the resist layer's 2 surface, whereupon a 0.5-μm L/S surface modification layer 4 composed of polysiloxane, as a metallic oxide layer, is formed on the surface of the exposed portion of the resist layer 2. The width of the surface modification layer 4, i.e., W20, is determined using an AFM.

Next, the resist layer 2 having the surface modification layer 4 thereon is RIE-etched using O$_2$ plasma, to form a 0.5-μm L/S resist pattern 5. Thereafter, the width of the resist pattern 5, i.e. , W21, is determined using the AFM.

Figure 16:
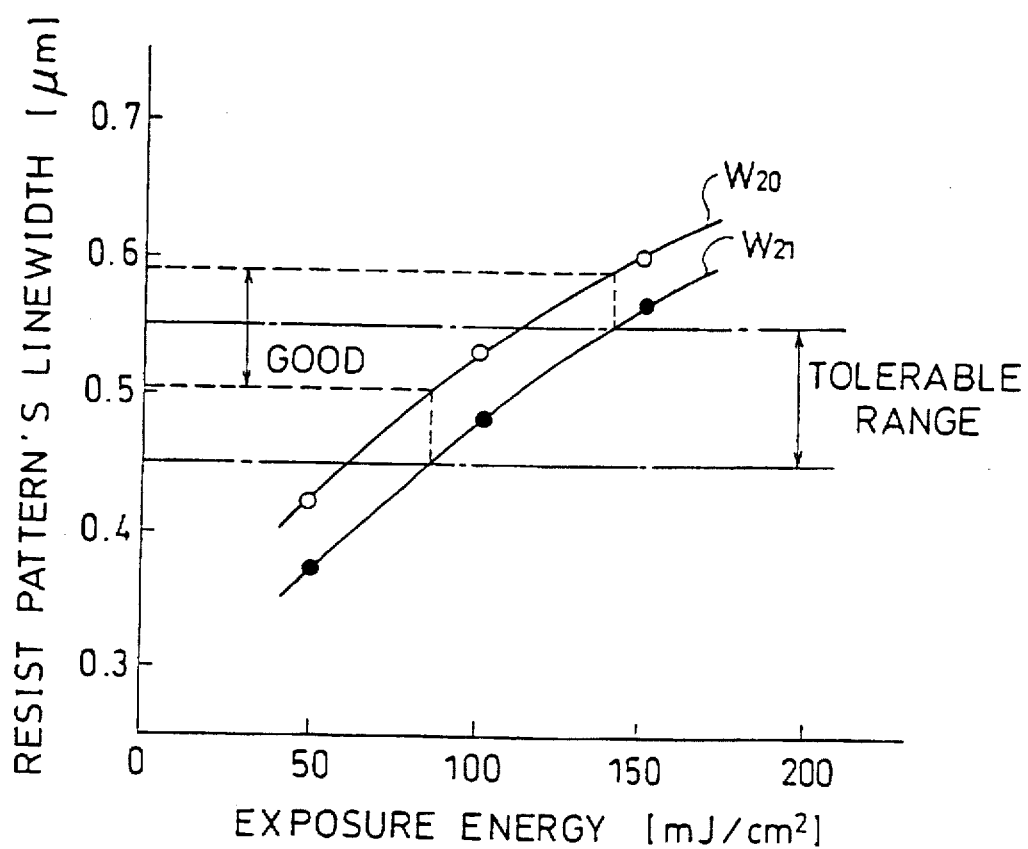
FIG. 16 is a graph showing a correlation between exposure energy dose and RPL in the third preferred embodiment method.

Next, a correlation of W20(the surface modification layer's 4 width) and W21 (the post-develop resist pattern's 5 RPL) is found as shown in FIG. 16.

Next, an actual resist layer is exposed to light to a predetermined pattern. An actual surface modification layer is formed on the pattern-exposed resist layer. Thereafter, the width of the actual surface modification layer is determined.

The W20 versus W21 correlation as shown in FIG. 16 is used to find an estimated RPL that is an RPL corresponding to an actual surface modification layer's width. In the graph of FIG. 16, the ordinate indicates the surface modification layer's width (the RPL). Whether an estimated RPL falls in a range of RPL tolerance limits is determined. When an estimated RPL can be tolerated, the resist layer 2 is RIE-etched with, for example. O$_2$ plasma.

Figure 17:
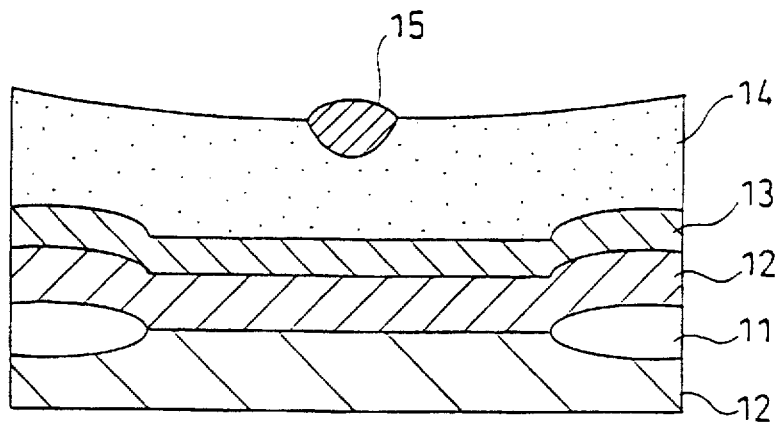
FIG. 17, comprised of (a), (b), and (c), shows steps of the formation of a resist pattern according to the third preferred embodiment method.
Figure 17:
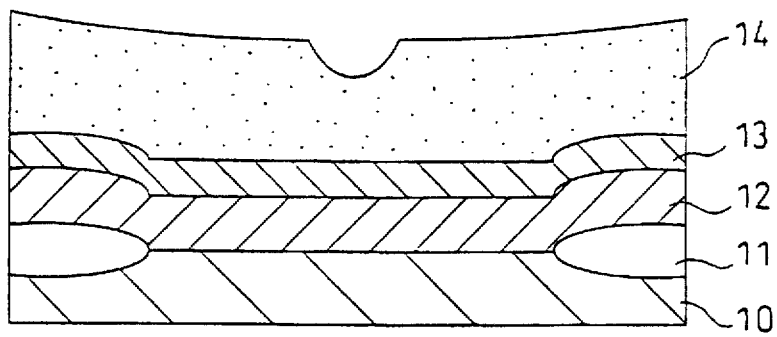
Figure 17:
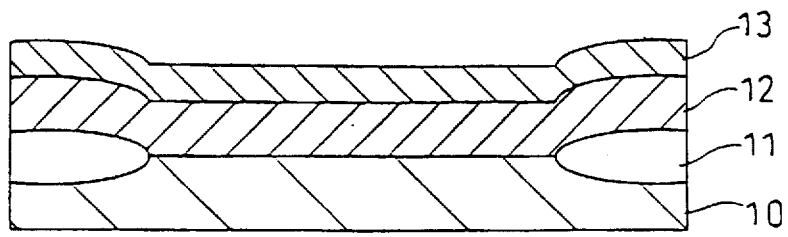

On the other hand, when an estimated RPL is found not to fall in the range, the FIG. 17 process is performed. As shown in FIG. 17(a), an isolator 11, a polysilicon layer 12, a silicon oxide layer 13, and resist layer 14 are formed, in that order, on a silicon substrate 10. If an estimated RPL corresponding to the width of a surface modification layer 15 of polysiloxane formed on the resist layer 14 is found not to fall in the range, the surface modification layer 15 is removed with $CF_4$ plasma (see FIG. 17(b)). Thereafter, as shown in FIG. 17(c)), *the resist layer 14 is removed with $O_2$* plasma to recycle the silicon substrate 10. This allows for the silicon substrate 10 having thereon the isolator 11, the polysilicon layer 12, and the silicon oxide layer 13, to be recycled without damage. In other words, a new resist layer can be formed on a recycled silicon substrate and a new resist pattern can be formed thereon. Since the silicon substrate 10 is not damaged, variations in the semiconductor device characteristic are prevented even when the silicon oxide layer 13 and the polysilicon layer 12 are etched according to a reformed resist pattern.

In the third embodiment, the width of the surface modification layer 15 of polysiloxane is precisely determined with an AFM, so that an RPL can be estimated precisely without performing a develop process on the resist layer 14. When an estimated RPL is found to be out of RPL tolerance limits, the silicon substrate 10 can be recycled without damage. Therefore, it becomes possible to reduce wafer-to-wafer RPL variations.

In the third embodiment, when an RPL exceeds RPL tolerance limits, the surface modification layer 15 is removed by $CF_4$ plasma and then the resist layer 14 is removed by $O_2$ plasma. Instead, it is possible that the surface modification layer 15 is removed by HF and then the resist layer 14 is removed using an organic solvent such as acetone.

In the third embodiment, the surface modification layer 15 is a metallic oxide layer but it may be replaced by a silylated layer as shown in the second embodiment.

The invention claimed is:

1. A method of forming a resist pattern comprising the steps of:
   (a) forming a resist layer on a substrate;
   (b) exposing said resist layer to light to form a predetermined pattern;
   (c) subjecting said pattern- exposed resist layer for a thermal annealing process; and
   (d) developing said pattern-exposed resist layer for resist pattern formation wherein a desired resist pattern linewidth is formed by:
   (1) determining a height of a latent image formed on said resist layer after said resist layer is exposed to said light;
   (2) determining a relationship between the height of said latent image and a thermal annealing parameter;
   (3) determining a relationship between a resist pattern linewidth and said thermal annealing parameter;
   (4) correlating the height of said latent image and resist pattern linewidth based on relationships determined in steps (2) and (3) above;
   (5) determining a first correlation between said height of said latent image and resist pattern linewidth;
   (6) determining a second correlation between the thermal annealing parameter and resist pattern linewidth;
   (7) determining an actual latent-image height produced on an exposed resist layer;
   (8) estimating from said first correlation a resist-pattern linewidth that corresponds to said determined actual latent-image height and to a given value of said thermal annealing parameter;
   (9) estimating from said second correlation a thermal annealing parameter that corresponds to said given value of said thermal annealing exposure parameter and to said estimated resist patent linewidth;
   (10) determining from said second correlation, a value of said thermal annealing parameter that corresponds to a target resist-pattern linewidth and to said estimated thermal annealing parameter; and
   (11) subjecting, based on said thermal annealing parameter value found, said thermal annealing process on a resist layer.

2. A method of forming a resist pattern according to claim 1,
   wherein said thermal annealing parameter is a thermal annealing process time parameter or a thermal annealing process temperature parameter.

3. A method of forming a resist pattern according to claim 1,
   wherein said latent image height is determined using an atomic force microscope.

* * * * *

UNITED STATES PATENT AND TRADEMARK OFFICE
CERTIFICATE OF CORRECTION

PATENT NO. : 5,763,124
DATED : June 9, 1998
INVENTOR(S) : Koizumi, et. al.

It is certified that error appears in the above-identified patent and that said Letters Patent is hereby corrected as shown below:

Claim 1, line 6, delete "for" and insert --to--.

Signed and Sealed this

Fourteenth Day of March, 2000

Attest:

Q. TODD DICKINSON

Attesting Officer

Commissioner of Patents and Trademarks